US010125237B2

(12) United States Patent
Tashiro et al.

(10) Patent No.: US 10,125,237 B2
(45) Date of Patent: Nov. 13, 2018

(54) HEAT RADIATION SHEET AND HEAT RADIATION DEVICE

(75) Inventors: Noriji Tashiro, Mito (JP); Michiaki Yajima, Hitachi (JP); Tomonori Seki, Hitachi (JP); Atsushi Fujita, Hitachi (JP); Tooru Yoshikawa, Tsukuba (JP); Rei Yamamoto, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 12/993,307

(22) PCT Filed: May 22, 2009

(86) PCT No.: PCT/JP2009/059415
§ 371 (c)(1),
(2), (4) Date: Nov. 18, 2010

(87) PCT Pub. No.: WO2009/142290
PCT Pub. Date: Nov. 26, 2009

(65) Prior Publication Data
US 2011/0061852 A1   Mar. 17, 2011

(30) Foreign Application Priority Data

May 23, 2008 (JP) .................. 2008-135479

(51) Int. Cl.
| | |
|---|---|
| *F28F 7/00* | (2006.01) |
| *C08K 3/04* | (2006.01) |
| *C08L 21/00* | (2006.01) |
| *C08L 33/08* | (2006.01) |
| *H01L 23/373* | (2006.01) |
| *C08K 5/00* | (2006.01) |
| *C08K 5/521* | (2006.01) |
| *C08L 13/00* | (2006.01) |
| *C08L 15/00* | (2006.01) |
| *C08K 3/016* | (2018.01) |

(52) U.S. Cl.
CPC ............... *C08K 3/04* (2013.01); *C08L 21/00* (2013.01); *C08L 33/08* (2013.01); *H01L 23/3737* (2013.01); *C08K 3/016* (2018.01); *C08K 5/0066* (2013.01); *C08K 5/521* (2013.01); *C08L 13/00* (2013.01); *C08L 15/00* (2013.01); *H01L 2924/0002* (2013.01)

(58) Field of Classification Search
USPC ........................................................ 428/323
See application file for complete search history.

(56) References Cited

U.S. PATENT DOCUMENTS

| | | | | |
|---|---|---|---|---|
| 5,408,007 A * | 4/1995 | Mizuno et al. | ............... | 525/305 |
| 5,863,467 A | 1/1999 | Mariner et al. | | |
| 6,197,869 B1 * | 3/2001 | Weber et al. | ................. | 524/495 |
| 2001/0016620 A1 * | 8/2001 | Itoh et al. | ...................... | 524/528 |
| 2002/0086952 A1 * | 7/2002 | Chino et al. | ............... | 525/327.6 |
| 2002/0107318 A1 | 8/2002 | Yamada et al. | | |
| 2002/0197923 A1 * | 12/2002 | Tobita et al. | ................... | 442/74 |
| 2003/0191233 A1 * | 10/2003 | Lin et al. | ...................... | 524/588 |
| 2006/0004126 A1 | 1/2006 | Park et al. | | |

FOREIGN PATENT DOCUMENTS

| | | |
|---|---|---|
| CN | 101161721 | 4/2008 |
| EP | 2 071 002 | 6/2009 |
| JP | 62-131033 | 6/1987 |
| JP | 4-246456 | 9/1992 |
| JP | 5-247268 | 9/1993 |
| JP | 10-298433 | 11/1998 |
| JP | 11-1621 | 1/1999 |
| JP | 2001-106831 | 4/2001 |
| JP | 2001-316502 A | 11/2001 |
| JP | 2002-88171 A | 3/2002 |
| JP | 2002-121404 | 4/2002 |
| JP | 3305720 B2 | 7/2002 |
| JP | 2003-321554 | 11/2003 |
| JP | 2006-328213 | 12/2006 |
| JP | 2007-291267 | 11/2007 |
| JP | 2007-291576 | 11/2007 |
| JP | 2008-49607 | 3/2008 |
| WO | WO 2007/148729 | 12/2007 |
| WO | WO2008053843 | 5/2008 |

OTHER PUBLICATIONS

Transmittal of the English Translation of the International Preliminary Report on Patentability dated Jan. 20, 2011, for International (PCT) Application No. PCT/JP2009/059415.
Extended European Search Report, dated May 31, 2011, including Supplementary European Search Report and European Search Opinion, for EP Application No. 09750652.1-2102/2291066 (PCT/JP2009/059415).
Chinese Official Action dated Aug. 16, 2013, for CN Application No. 2009801180795.
Chinese Official Action dated Dec. 26, 2012, for CN Application No. 200980118079.5.
Taiwanese Official Action dated Nov. 21, 2013, for TW Application No. 098117160.
Taiwanese Official Action dated Jun. 30, 2014, in the counterpart Taiwanese patent application No. 098117160.
Office Action dated Jul. 23, 2015, for Chinese Application No. 200980118079.5, with English language translation thereof; 14 pages.
Office action dated Oct. 10, 2015, for counterpart Chinese Application No. 201310297046.X, together with English language translation thereof.

(Continued)

*Primary Examiner* — Cheng Yuan Huang
(74) *Attorney, Agent, or Firm* — Fitch, Even, Tabin & Flannery, L.L.P.

(57) ABSTRACT

A heat radiation sheet having high heat-radiation property and excellent handleability and having sheet properties permitting the sheet to cope with changes in use temperature thereof. Also provided is a heat radiation device using the sheet. The heat radiation sheet comprises: a binder component comprising: (A) a thermoplastic rubber component; (B) a thermosetting rubber component; and (C) a thermosetting rubber curing agent crosslinkable with the thermosetting rubber component (B); and an anisotropic graphite powder oriented into a specified direction in the binder component.

23 Claims, No Drawings

(56) References Cited

OTHER PUBLICATIONS

Office Action dated May 20, 2016, for Chinese Application No. 201310297046.X, together with English language translation.
Office Action dated Nov. 15, 2016, for Chinese Application No. 201310297046.X, together with English languahe translation thereof.
Office Action dated Feb. 2, 2016, for Chinese Application No. 200980118079.5, together with an English language translation thereof.
Office Action dated May 12, 2017, for Chinese Application No. 201310297046.X, together with English language translation thereof.
Office Action dated Jul. 7, 2017, for Indian Application No. 2454/MUMNP/2010.
Chinese Official Action dated Dec. 25, 2014, for CN Application No. 20131029046.X.
Official Action dated Mar. 9, 2015, in counterpart Chinese Application No. 2009801180795.
Korean Official Action dated Nov. 24, 2014, for KR Application No. 10-2010-7026194.

\* cited by examiner

HEAT RADIATION SHEET AND HEAT RADIATION DEVICE

TECHNICAL FIELD

The present invention relates to a heat radiation sheet and a heat radiation device. Specifically, the invention relates to a heat radiation sheet having heat-radiating property and an excellent handleability, and further having sheet properties permitting the sheet to cope with changes in use temperature thereof, and a heat radiation device using the sheet.

BACKGROUND ART

In recent years, the amount of data processed in personal computers (abbreviated to "PCs" hereinafter) or measuring instruments has been abruptly increased, and the integration degree or density of multi-layered wiring boards or semiconductors, which are important members in each of the instruments, has been becoming high, and electric parts have been becoming large in size.

In such a background, the heat quantity generated inside a PC has also been becoming larger than that of any conventional PC. In the operation thereof, troubles (such as malfunction and operation inability) and other problems have been caused.

In order to solve the problem, individual PC manufactures take measures as follows: in order to cool the inside rapidly, a cooling fan higher in performance than conventional fans is set; or in order to improve the heat-radiating property of a heat generation body, a soft heat radiation material is interposed between the heat generation member and a heat radiation plate to improve the contact between the members, thereby giving a better heat-radiating property. However, the improvement in the performance of the cooling fan results in making the PC size large, and causes an increase of noises and a rise in costs.

Thus, attention has been paid to a heat radiation member used between the heat generation body and the heat radiation plate, and to a heat radiation material which is excellent in heat-radiating property, smaller in thickness, and small in change in physical properties which follows a change in PC inside temperature.

As a typical heat radiation member, a grease type material (material having stickiness) is used in the state that the material is interposed between a heat generation member and a heat radiation plate (such as a metallic plate) to improve the heat radiation property. However, according to this method, the stickiness of the grease causes a poor handleability, so as to result in a poor workability when the heat radiation device is fabricated. Moreover, with a temperature change, the viscosity of the grease is largely changed; thus, a change in the heat-radiating property has been become a problem.

As a workability-improved material of the grease type heat radiation material, attention has been paid to a heat radiation sheet having softness and surface tackiness (bonding function based on stickiness), and being stable in physical properties.

However, heat radiation sheets commercially available at present are poor in balance between problems against heat-radiating property (change in characteristics in accordance with the use temperature) and against handleability on the basis of insufficient strength, and sheet properties (softness and surface tackiness).

As a heat radiation metallic material having softness, indium made into a sheet form is used. However, the use thereof is limited within a partial scope since the metal is high in costs.

In such a situation, suggested are various composite materials that are low in costs and excellent in heat-radiating property and workability, and products worked therefrom. For example, Patent Document 1 discloses a heat-radiating resin shaped product wherein graphite powder is blended with a thermoplastic resin, and Patent Document 2 discloses a polyester resin composition containing graphite, carbon black or the like. Patent Document 3 discloses a rubbery composition into which artificial graphite having a particle diameter of 1 to 20 μm is incorporated, and Patent Document 4 discloses a composition wherein spherical graphite having a crystal plane interval of 0.330 to 0.340 nm is incorporated into a silicone rubber. Patent Document 5 describes a highly heat-radiating composite material characterized in that specified graphite particles are pressed/compressed in a solid, whereby the particles are lined in parallel to the surfaces of the composition, and a process for producing the material.

However, even a shaped product as described above, wherein specified graphite powder is dispersed at random or wherein graphite particles are pressed/compressed to be lined, is not sufficient yet in thermoconductivity.

Against this, Patent Document 6 discloses a heat-radiating shaped product wherein the c axis of the crystal structure of graphite powder is oriented perpendicularly to the heat radiation direction, and a process for producing the product.

Heat radiation sheets are each required to be excellent in sheet handleability in order to makes it easy to fabricate a heat radiation device therefrom. For the method of making better use of the sheet handleability, there is generated a need that the sheet is caused to have properties such as followability coping with irregularities, curves or other especial shapes of a heat generation body surface and a heat radiation member surface, or a stress relieving function or some other function. For example, in heat radiation from a display panel, or some other large area, a sheet-handling function is an important theme from the viewpoint of an improvement in productivity. Accordingly, functionalization of properties of a heat radiation sheet has been advancing, and it has been intensely desired to develop a sheet that is excellent in tackiness, softness, heat resistance and strength, and is high in heat-radiating property.

However, the heat-radiating shaped product disclosed in Patent Document 6 is insufficient in tackiness, softness, heat resistance and strength although the product is excellent in heat-radiating property. Thus, the product has a problem about the sheet handleability thereof.

PRIOR ART LITERATURES

Patent Literatures

Patent Literature 1: JP-A No. 62-131033
Patent Literature 2: JP-A No. 04-246456
Patent Literature 3: JP-A No. 05-247268
Patent Literature 4: JP-A No. 10-298433
Patent Literature 5: JP-A No. 11-001621
Patent Literature 6: JP-A No. 2003-321554

DISCLOSURE OF THE INVENTION

Technical Problem

The invention provides a heat radiation sheet being excellent in heat-radiating property and handleability, and having sheet properties permitting the sheet to cope with changes in use temperature thereof, and a heat radiation device using the heat radiation sheet.

Solution to Problem

In order to solve the problems, the inventors have repeatedly made eager investigations to find out that when anisotropic graphite powder is oriented into a specified direction in a binder component, a sheet can have an excellent heat-radiating property, and when a thermoplastic rubber component and a thermosetting rubber component are used as the binder component for a heat radiation sheet, a sheet can have excellent tackiness, heat resistance and strength.

Accordingly, the invention is as follows:

(1) A heat radiation sheet, wherein anisotropic graphite powder is oriented into a specified direction in a binder component comprising: (A) a thermoplastic rubber component; (B) a thermosetting rubber component; and (C) a thermosetting rubber curing agent crosslinkable with the thermosetting rubber component (B).

(2) The heat radiation sheet according to item (1), wherein the orientation in the specified direction is an orientation in the thickness direction of the heat radiation sheet.

(3) The heat radiation sheet according to item (1) or (2), wherein the crosslinkage density of the thermosetting rubber component (B) and the thermosetting rubber curing agent (C) is adjusted.

(4) The heat radiation sheet according to any one of items (1) to (3), wherein the thermosetting rubber component (B) is a modified synthetic rubber modified with a carboxylic group, a hydroxyl group or an amino group.

(5) The heat radiation sheet according to item (4), wherein as the thermosetting rubber component (B), use is made of a carboxyl-group-modified solid synthetic rubber that is a solid at normal temperature, and a carboxyl-group-modified liquid synthetic rubber that is a liquid at normal temperature.

(6) The heat radiation sheet according to any one of items (1) to (5), wherein the thermosetting rubber curing agent (C) is an epoxy-group-containing compound.

(7) The heat radiation sheet according to any one of items (1) to (6), further comprising a phosphoric ester.

(8) The heat radiation sheet according to any one of items (1) to (7), wherein the anisotropic graphite powder is pulverized powder of an expanded graphite shaped sheet and has a lamella needle branch shape or a dendritic shape, and the anisotropic graphite powder is oriented into the thickness direction of the sheet.

(9) The heat radiation sheet according to any one of items (1) to (8), wherein the average particle diameter of the anisotropic graphite powder is within the range from 50 to 2000 μm, and the bulk density thereof is within the range from 0.1 to 1.5 $g/cm^3$.

(10) The heat radiation sheet according to any one of items (1) to (9), which is obtained by a method comprising the steps of:

forming a primary sheet by orienting a composition comprising the anisotropic graphite powder and the binder component so as to make the anisotropic graphite powder in the composition into a direction substantially parallel to the main surfaces;

yielding a shaped body by laminating the primary sheet(s) onto each other; and slicing the shaped body at an angle of 45 to 80 degrees to any normal line extended out from the surfaces of the primary sheet.

(11) The heat radiation sheet according to any one of items (1) to (9), which is obtained by a method comprising the steps of:

forming a primary sheet by orienting a composition comprising the anisotropic graphite powder and the binder component so as to make the anisotropic graphite powder in the composition into a direction substantially parallel to the main surfaces;

yielding a shaped body by winding the primary sheet around an axis along the orientation direction of the graphite powder; and slicing the shaped body at an angle of 45 to 80 degrees to any normal line extended out from the surfaces of the primary sheet.

(12) A heat radiation device, wherein the heat radiation according to any one of items (1) to (11) is combined with a member different therefrom.

Effects of the Invention

According to the invention, a heat radiation sheet can be provided which is excellent in heat-radiating property (thermoconductivity) and good in balance between sheet properties (tackiness, heat resistance, softness and strength).

BEST MODE FOR CARRYING OUT THE INVENTION

The heat radiation sheet of the invention is a sheet wherein anisotropic graphite powder is oriented into a specified direction in a binder component comprising: (A) a thermoplastic rubber component; (B) a thermosetting rubber component; and (C) a thermosetting rubber curing agent crosslinkable with the thermosetting rubber component (B).

A heat radiation sheet may be used in the state of being sandwiched between a heat generation member and a heat radiation plate. Since the temperature of the use environment thereof is varied under conditions that a constant pressure is applied thereto, it is an essential requirement for the used heat radiation sheet that a change in the properties thereof is small. Therefore, only the thermoplastic rubber component (A) as a binder cannot cope with an improvement in heat resistance and strength.

On the other hand, when only the thermosetting rubber component (B) (and the thermosetting rubber curing agent (C)) is/are used as a binder component, there is caused a problem that the tackiness and the softness decline.

In the invention, a combination of the thermoplastic rubber component (A) and the thermosetting rubber component (B) is used as a binder component, whereby advantages of the two can be gained.

In the heat radiation sheet of the invention, anisotropic graphite powder is orientated in a specified direction, whereby heat can be effectively radiated. The direction of the oriented anisotropic graphite powder is preferably parallel to the thickness direction of the sheet. In this manner, the thermoconductivity is improved in the sheet thickness direction. Thus, when the sheet is set between a heat generation body and a heat radiation plate, heat from the heat generation body can be effectively radiated to the heat radiation plate.

In the invention, the matter that the anisotropic graphite powder is "oriented into the thickness direction of the heat radiation sheet" means the following: first, the heat radiation sheet is cut into a regular octagon, and the section of each of its sides in the thickness direction is observed by use of a fluorescence microscope; about each of 50 particles selected at will from the graphite particles in the section of any one of the sides, the angle of the long axis of the anisotropic graphite powder particle to the surfaces of the heat radiation sheet (when the angle is 90 degrees or more, the supplementary angle is used) is measured along the direction in which the particle is viewed; and the average of the resultant values falls in the range of 60 to 90 degrees.

In the heat radiation sheet of the invention, the binder component further comprises the thermosetting rubber curing agent (C), which is crosslinkable with the thermosetting rubber component (B), whereby the heat radiation sheet turns into a state that the thermoplastic rubber component (A) and the thermosetting rubber component (B) crosslinked with the thermosetting rubber curing agent (C) are mixed with each other after the sheet is thermally treated. As a result, the sheet handleability is improved. It is possible to attain function-sharing for maintaining the heat-radiating property and the sheet properties (such as the tackiness, heat resistance, softness and strength) also against the temperature change when a PC is used.

By effect of the thermoplastic rubber component (A), excellent properties can be gained for softness (contact to members) and tackiness (bondability onto the members). Additionally, by effect of the thermosetting rubber component (B) crosslinked with the thermosetting rubber curing agent (C), the handleability is improved (the strength is improved), and the properties of the sheet can be maintained against a change in the temperature of the inside of a PC (the heat resistance is improved), so that a stable heat-radiating property can be obtained also against an abrupt high-temperature change in the use environment.

First, the individual components used in the invention will be described.

<Thermoplastic Rubber Component (A)>

The thermoplastic rubber component (A) used in the invention is a component wherein the movement of a molecular chain is largely varied in accordance with the use temperature of the heat radiation sheet. This makes it possible to render the heat radiation sheet to have excellent in softness (adhesiveness to members) and tackiness (bondability onto the members).

(A) The thermoplastic rubber component (A) may be, for example, an acrylic rubber obtained by copolymerizing an (ethyl, butyl or 2-ethylhexyl) acrylate with a different monomer; ethylene-propylene rubber obtained by causing ethylene and propylene to react with each other in the presence of a catalyst; butyl rubber obtained by copolymerizing isobutylene and isoprene with each other; styrene butadiene rubber obtained by copolymerizing butadiene and styrene with each other; or NBR made from acrylonitrile and butadiene.

The thermoplastic rubber component (A) given as examples above may be used alone or in a mixture form.

About an optimal molecular weight of the used thermoplastic rubber component (A), the weight-average molecular weight is preferably within the range from 20 to 2000000, in particular preferably within the range from 300000 to 1500000. If the weight-average molecular weight is 200000 or less, the glass transition temperature of the finally obtained heat radiation sheet lowers. Thus, physical properties of the sheet that follow a change in the inside temperature of a PC are largely varied, so that the heat-radiating property is easily changed.

If the weight-average molecular weight of the used thermoplastic rubber component (A) is 2000000 or more, the miscibility with the anisotropic graphite powder declines and further the tackiness and the softness become poor.

The amount of the used thermoplastic rubber component (A) is not particularly limited, and is preferably from 10 to 70 parts by mass relative to 100 parts by mass of the total of the thermoplastic rubber component (A) and the thermosetting rubber component (B) in the binder component. If the amount is out of this range, the sheet properties (the tackiness and the softness) cannot be maintained.

Specific examples of the thermoplastic rubber component (A) include acrylic rubbers (trade name: THR-811DS, manufactured by Nagase ChemteX Corp.; weight-average molecular weight: 500000), (trade name: Nipol AR31, manufactured by Nippon Zeon Co., Ltd.), (trade name: Nipol AR51, manufactured by Nippon Zeon Co., Ltd.), (trade name: Nipol AR71, manufactured by Nippon Zeon Co., Ltd.), (trade name: Nipol AR32, manufactured by Nippon Zeon Co., Ltd.), and (trade name: Nipol AR42W, manufactured by Nippon Zeon Co., Ltd.).

<Thermosetting Rubber Component (B)>

In the invention, the "thermosetting rubber component" is a component before it is cured. When the component is thermally treated together with the thermosetting rubber curing agent (C), the resultant turns into a cured composition.

When the thermosetting rubber component (B) is crosslinked with the thermosetting rubber curing agent (C) in the invention, the thermosetting rubber component (B) turns to a component wherein a change in the movement of a molecular chain is small regardless of the use temperature of the heat radiation sheet. Thus, the handleability is improved (the strength is improved), and the properties of the sheet can be maintained against a change in the temperature of the inside of a PC (the heat resistance is improved), so that a stable heat-radiating property can be obtained also against an abrupt high-temperature change in the use environment.

The thermosetting rubber component (B) used in the invention is not particularly limited, and may be any modified synthetic rubber that has a functional group crosslinkable with the thermosetting rubber curing agent (C). When the thermosetting rubber component (B) is selected, the kind of the thermosetting rubber curing agent (C) is an important point.

As a component that can be crosslinked (vulcanized) with an ordinary rubber, use has been hitherto made of sulfur, a sulfur compound, a peroxide or the like. However, from the viewpoint of the environment (bad smell), safety and hygiene, and the control of the crosslinkage with rubber, it cannot be concluded that the rubber-crosslinking based on the component is optimal.

The crosslinking of the thermosetting rubber component (B) according to the invention aims not simply to increase the molecular weight of the thermosetting rubber component (B) on the basis of the crosslinking but to reflect the formation of a three-dimension structure between the thermosetting rubber component (B) molecules, through the structure and characteristics of the material used as the thermosetting rubber curing agent (C), onto properties of the sheet. Thus, a thermosetting rubber component (B) having a functional group crosslinkable with the thermosetting rubber curing agent (C) is preferable.

Considering the aim, preferred examples of the functional group reactive with the thermosetting rubber curing agent (C) include a carboxyl group, a hydroxyl group, and an amino group. Thus, it is preferred to use, as the thermosetting rubber component (B), a modified synthetic rubber modified with such a functional group. From the viewpoint of sheet properties and costs, particularly preferred are NBR which is a copolymer made from acrylonitrile, butadiene and methacrylic acid, and acrylic rubber which is obtained by copolymerizing butyl acrylate, acrylonitrile, and acrylic acid.

It is preferred to use, as the thermosetting rubber component (B), a component that is a solid at normal temperature and a component that is a liquid at normal temperature together since heat resistance and softness can be obtained with a good balance by a combination of strength and heat resistance, which are characteristic of the solid component at normal temperature, with softness which is a characteristic of the liquid component at normal temperature. Normal temperature referred to herein is defined as a temperature ranging from 15 to 30° C.

The solid component at normal temperature is preferably a modified synthetic rubber that is a solid at normal temperature, has a weight-average molecular weight of 100000 or more, and is modified with a carboxyl, hydroxyl or amino group, or some other group. The component is more preferably a carboxyl-group-modified solid synthetic rubber, in particular preferably a carboxyl-group-modified solid NBR.

The liquid component at normal temperature is preferably a modified synthetic rubber that is a liquid at normal temperature, has a weight-average molecular weight of 90000 or less, and is modified with a carboxyl, hydroxyl or amino group, or some other group. The component is more preferably a carboxyl-group-modified liquid synthetic rubber, in particular preferably a carboxyl-group-containing liquid acrylic rubber.

The carboxyl-group-modified NBR and the carboxyl-group-containing acrylic rubber, which are preferably usable, are not particularly limited about the molecular weights thereof. In accordance with the usage, a carboxyl-group-modified solid synthetic rubber (preferably having a weight-average molecular weight within the range of 150000 to 500000) and a carboxyl-group-modified liquid synthetic rubber (preferably having a weight-average molecular weight within the range of 30000 to 90000) may be used alone or in a mixture form. When these are used in a mixture form, the ratio therebetween is decided at will in accordance with required properties. When the thermosetting rubber component that is a solid at normal temperature is used in a larger proportion, the strength and the heat resistance tend to be improved. When the thermosetting rubber component that is a liquid at normal temperature is used in a larger proportion, the softness tends to be improved.

A specific example of the thermosetting rubber component (B) that is a solid at normal temperature is a carboxyl-group-modified NBR (trade name: Nippol 1072 manufactured by Nippon Zeon Co., Ltd., weight-average molecular weight: 250000, carboxyl group concentration: 0.75 (KOHmg/g)).

Specific examples of the thermosetting rubber component (B) that is a liquid at normal temperature include a carboxyl-group-modified NBR (trade name: Nippol DN601 manufactured by Nippon Zeon Co., Ltd., weight-average molecular weight: 68000, carboxyl group concentration: 0.75 (KOHmg/g)); and X750, X740, X146 and X160 (manufactured by JSR Corp.).

The use amount of the thermosetting rubber component (B), which is crosslinkable with the thermosetting rubber curing agent (C), is preferably within the range from 10 to 70 by mass relative to 100 parts by mass of the total of the thermoplastic rubber component (A) and the thermosetting rubber component (B) in the binder component. If this amount is out of this range, a heat radiation sheet with a good balance therebetween is not easily obtained.

<Thermosetting Rubber Curing Agent (C)>

A reaction of a modified synthetic rubber having a hydroxyl group as the thermosetting rubber component (B) and an isocyanate (NCO) compound as the thermosetting rubber curing agent (C) may be used. However, any isocyanate compound, which reacts with water instantaneously, is not preferred since the compound is neither easily handled nor controlled about the reaction thereof.

The thermosetting rubber curing agent (C) used in the invention is not particularly limited, and is preferably a material which is easily reactive with a carboxyl group, hydroxyl group or amino group, or some other group that the thermosetting rubber component (B) has, and which has stable physical properties.

When a carboxyl-group-modified synthetic rubber or an amino-group-modified synthetic rubber is used as the thermosetting rubber component (B), the thermosetting rubber curing agent (C) is preferably an epoxy-group-containing compound. The agent (C) is in particular preferably an epoxy region having two or more epoxy groups. The epoxy-group-containing compound also acts to improve the bonding force of the heat radiation sheet to other members and the heat resistance thereof, to improve the miscibility of the binder component with the anisotropic graphite powder, or to attain some other purpose. Accordingly, the heat radiation sheet of the invention is a sheet having physical properties onto which characteristics of the used epoxy-group-containing compound are partially reflected.

The molecular weight and the structure of the epoxy-group-containing compound used in the invention are not particularly limited. In the case of considering the compatibility of the thermoplastic rubber component (A) and the thermosetting rubber component (B) with each other, the heat resistance, and costs, the compound is preferably an epoxy-group-containing compound that has a number-average molecular weight (Mn) of 500 or less and that is polymerized from epichlorohydrin and bisphenol A.

The ratio between the thermosetting rubber component (B), in particular the carboxyl-group-modified synthetic rubber or amino-group-modified synthetic rubber, and the epoxy-group-containing compound as the thermosetting rubber curing agent (C) is decided by the concentration of the carboxyl groups or amino groups contained in the thermosetting rubber component (B), and the molecular weight and the number (chemical equivalent) of the epoxy groups of the epoxy-group-containing compound. However, chemical-equivalent blending is difficult since the molecular weight of the thermosetting rubber component (B) is large. Usually, the amount of the epoxy-group-containing compound is preferably from 1 to 30 parts by mass relative to 100 parts by mass of the carboxyl-group-modified synthetic rubber or amino-group-modified synthetic rubber. If the blend amount of the epoxy-group-containing compound is 1 part or less by mass, the crosslinkage density is not improved by aid of the epoxy-group-containing compound. Additionally, it is not expected that the tackiness and the miscibility of the binder component with the anisotropic graphite powder are improved.

If the blend amount is more than 30 parts by mass, the epoxy-group-containing compound that does not contribute to the crosslinking increases, so that the heat resistance and the sheet properties tend to decline.

As the need arises, a curing promoter such as an isocyanate or an amine compound is used.

The reaction between the thermosetting rubber curing agent (C) and the thermosetting rubber component (B) is attained by thermal treatment. Conditions for the thermal treatment are not particularly limited. Under conditions that the temperature is 150° C. and the treatment time is 60 minutes, it is verified that functional groups such as carboxyl, hydroxyl and amino groups are completely lost (determined by IR). This can be decided as a completely cured state. Accordingly, when it is desired that the curing strain is decreased in the heat radiation sheet, the treatment is conducted at low temperature for a long time. In order to improve the productivity, the thermal treatment is conducted at high temperature for a short time.

The crosslinkage density obtained by the crosslinking between the thermosetting rubber curing agent (C) and the thermosetting rubber component (B) may be set at will in accordance with the thermal treatment conditions.

Since the crosslinkage density of the thermosetting rubber component (B) and the thermosetting rubber curing agent (C) contained in the binder component can be varied in accordance with the thermal treatment conditions, it is possible to provide a heat radiation sheet having properties consistent with requests of a client. When it is desired that, for example, preference for tackiness to a heat generation member and a heat radiation plate is given to the heat radiation sheet of the invention, the heat radiation sheet without being thermally treated can be used as an adhesive sheet, and then the sheet may be heated so as to be completely cured. When greater importance is attached to the productivity than to the tackiness, use may be made of a method of treating the heat radiation sheet of the invention thermally to cure completely the thermosetting rubber component (B) and the thermosetting rubber curing agent (C) in the binder component, and setting the sheet between a heat generation member and a heat radiation plate by aid of the tackiness of the thermoplastic rubber component (A) dispersed in the binder component, or some other method.

At any rate, before the heat radiation sheet of the invention is used as a heat radiation member, the thermosetting rubber component (B) and the thermosetting rubber curing agent (C) are completely cured. In the form of the heat radiation sheet before the sheet is used as a heat radiation member, the crosslinkage density may be varied in accordance with a request of a client.

<Anisotropic Graphite Powder>

The anisotropic graphite powder used in the invention, which functions as a heat radiation material, is preferably pulverized powder of an expanded graphite shaped sheet, and preferably has a lamella needle branch shape or a dendritic shape.

The process for producing pulverized powder of an expanded graphite shaped sheet includes, for example, the following steps:

(1) expanded graphite is produced,
(2) the expanded graphite is used to form an expanded graphite shaped sheet,
(3) the expanded graphite shaped sheet is pulverized, and
(4) the resultant is classified to produce anisotropic graphite powder.

The method for producing the expanded graphite in the step (1) is not particularly limited. The graphite can be produced through, for example, the step of immersing natural graphite and the like, as starting materials, into a solution containing an acidic material and an oxidizer to generate a graphite interlayer compound, and the step of heating the graphite interlayer compound to expand the resultant graphite crystal into the C axis direction thereof to prepare the expanded graphite. In this way, the expanded graphite becomes worm-form short fibers to turn into a form that the fibers are complicated and intertwined with each other.

The expansion coefficient of the expanded graphite is not particularly limited, and is preferably 10 or more, more preferably from 50 to 500, considering the heat-radiating property. If expanded graphite having an expansion coefficient of 10 or less is used, the strength of the resultant expanded graphite shaped sheet lowers. If expanded graphite having an expansion coefficient of 500 or more is used, it becomes difficult to form any expanded graphite shaped sheet. It is also preferred that the expanded graphite is thermally treated at a higher temperature as the need arises to remove impurities contained in the expanded graphite, and then use the resultant.

The graphite as the raw material of the expanded graphite is not particularly limited, and is preferably a graphite with high-degree developed crystals, such as natural graphite, kish graphite or thermally decomposed graphite. Considering a balance between the resultant properties and economical efficiency, natural graphite is preferred. Natural graphite to be used is not particularly limited, and may be a commercially available product, such as F48C (manufactured by Nippon Graphite Industries, Ltd.), H-50 (manufactured by Chuetsu Graphite Works Co., Ltd.) or the like. The product is preferably used in a scaly form and with a scaly nature.

In the step (1), the acidic material used to treat the graphite may be generally a material capable of generating an acidic ion (anion) which invades gaps between graphite layers to have a sufficient expanding power, such as sulfuric acid. Sulfuric acid as the acidic material is used at an appropriate concentration, and is preferably sulfuric acid having a concentration of 95% or more by mass, in particular preferably concentrated sulfuric acid. The use amount of the acidic material is not particularly limited, and is decided in accordance with a target expansion coefficient. The acidic material is used preferably in an amount of 100 to 1000 parts by mass relative to 100 parts by mass of the raw material graphite.

The oxidizer used together with the acidic material may be hydrogen peroxide, potassium perchlorate, potassium permanganate, or dichromate. When hydrogen peroxide is used as the oxidizer, hydrogen peroxide is preferably used in the form of an aqueous solution. At this time, the concentration of hydrogen peroxide is not particularly limited, and is preferably from 20 to 40% parts by mass. The use amount thereof is not particularly limited. It is preferred that hydrogen peroxide is incorporated in the form of hydrogen peroxide water in an amount of 5 to 60 parts by mass relative to 100 parts by mass of the raw material graphite.

In the step (2), the method for shaping the resultant expanded graphite to be made into a sheet form is not particularly limited. The graphite can easily be made into a sheet form by rolling, pressing or the like at normal temperature. The density of the resultant expanded graphite shaped sheet layer is substantially decided in accordance with the filling amount of the expanded graphite and the shaping pressure. The density of the expanded graphite shaped sheet to be used is not particularly limited, and is preferably within the range from 0.07 to 1.5 g/cm$^3$. If the density is 0.07 g/cm$^3$ or less, the expanded graphite shaped sheet is brittle and low in strength. If the density is 1.5 g/cm$^3$ or more, a condensed product of the expanded graphite tends to be broken at the time of the shaping.

The expanded graphite shaped sheet may be yielded by the above-mentioned producing method. However, products described below may be available to be used. The expanded graphite shaped sheet used in the invention may be CAR-BOFIT HGP-105, HGP-207, which are manufactured by Hitachi Chemical Co., Ltd, or the like.

Machines used in the steps (3) and (4) are not particularly limited, and may be an ordinary dry pulverizer and dry classifier. The machines make it possible to yield anisotropic graphite powder in a lamella needle branch form or a dendritic form. One feature of the heat radiation sheet of the invention is the shape of the anisotropic graphite powder. If the shape is a spherical shape, a shape close to a sphere, or the like, the contact between particles of the anisotropic graphite powder, which will be described later, becomes mild, so that a target heat radiation sheet, which is high in heat-radiating property, cannot be obtained.

The wording "lamella needle branch shape" means such a shape that a pointed leaf, as in a conifer, is made flat. The wording "dendritic shape" means such a branch-like shape as twigs are intertwined with each other. These shapes are verified by use of an SEM photograph.

The particle diameter and the density of the an isotropic graphite powder each have an optima range. The average particle diameter (D50) is preferably within the range from 50 to 2000 μm. If the average particle diameter of the anisotropic graphite powder is 50 μm or less, the anisotropy of the graphite, which influences the heat-radiating property that is a feature of the invention, is decreased so that the possibility of the contact between the graphite powder particles is reduced. As a result, the heat-radiating property tends to decline. If graphite particles having an average particle diameter of 2000 μm or more are used, the particles are not evenly mixed with the binder component with ease since the particle diameter is too large. The heat-radiating properties and physical properties of heat radiation sheets formed by use of the particles are easily dispersed. About the density, the bulk density is preferably from 0.1 to 1.5 g/cm$^3$.

The blend proportion of the anisotropic graphite powder in the heat radiation sheet is preferably within the range from 20 to 60% by mass of the whole of the blend. If the proportion is far smaller than 20% by mass, the heat-radiating effect is not obtained very much. If the proportion is more than 60% by mass, the sheet tends to become hard.

<Other Components in the Heat Radiation Sheet of the Invention>

Other components used in the heat radiation sheet of the invention are a flame retardant and others. The flame retardant is not particularly limited; however, the flame retardant needs to be selected, considering the compatibility with the binder component of the heat radiation sheet, the heat resistance, and physical properties of the heat radiation sheet to be obtained since the retardant functions as a part of the binder component.

The flame retardant may be an ordinary halogenated compound. Considering a balance between the sheet properties, a phosphate flame retardant is preferred. Examples thereof include aliphatic phosphates such as trimethyl phosphate and triethyl phosphate; aromatic phosphates such as triphenyl phosphate and tricresyl phosphate; and aromatic condensation type phosphates such as bisphenol A bis(diphenyl phosphate). These may be used alone or in a mixture form.

The use amount of the flame retardant is preferably within the range from 5 to 50 parts by mass relative to 100 parts by mass of the binder component in the heat radiation sheet. The amount is varied in accordance with the use amount of the anisotropic graphite powder, and may be decided at will. If the use amount is less than 5 parts by mass, a target flame retardancy is not easily obtained. If the flame retardant is incorporated in an amount over 50 parts by mass, a plasticizing effect is largely reflected so that the softness of the heat radiation sheet to be obtained tends to decline abruptly.

<Process for Producing the Heat Radiation Sheet of the Invention>

A process for producing the heat radiation sheet of the invention includes the following steps:

(a) the step of forming a primary sheet after mixing the anisotropic graphite powder with the binder component to yield a composition, (b) the step of yielding a shaped body by laminating the primary sheet(s) onto each other or by winding the primary sheet, and (c) the step of yielding the heat radiation sheet by slicing the shaped body.

First, in order to form the primary sheet in the step (a), the binder component, the anisotropic graphite powder and other components are mixed with each other to yield a composition. The method for mixing the binder component, the anisotropic graphite powder and the other components with each other is not particularly limited, and is preferably a method of mixing the individual components with each other into an even state without changing the natures thereof in a short period. In particular preferably, a heated pressuring-type kneader is used to mix the components. Conditions for the mixing are decided at will in accordance with the molecular weight of the used binder component, the blend amount of the anisotropic graphite powder, and others. When a solid polymer component and a liquid low-molecular component are used as the binder component, the order that the individual components are charged into an ordinary kneader is as follows: the solid component is first charged into the kneader to masticate the component, and in this state the liquid component is incorporated thereinto bit by bit, thereby mixing the components with each other. In this way, an even binder component is effectively yielded.

When it is desired that the solid component and the liquid component are made into an evener state, the solid component and the liquid component are mixed with each other into an even state by means of a kneader and a roll (a small amount of the other components may be blended therewith) and then the mixture is mixed with the other components again by means of a kneader.

When the viscosity of the composition is high so that frictional heat is generated in the mixing, so as to cause a fear that crosslinking reaction is caused between the thermosetting rubber curing agent (C) and the thermosetting rubber component (B), it is preferred to charge the thermosetting rubber curing agent (C) into the kneader about 10 to 20 minutes before from the end of the mixing. By measuring the viscosity of the composition with a curastometer or a Mooney viscometer, it is decided whether or not the kneading of the composition in the kneader (as well as the reaction of the thermosetting rubber curing agent (C)) makes the composition even.

About a target viscosity at this time, it is preferred that various blend systems are used to make preliminary investigations (to, for example, change the mixing temperature and the mixing period) and then the viscosity value of a heat radiation sheet composition giving target physical properties are rendered the target viscosity.

The viscosity of the composition is hardly affected by the curing reaction, and is affected by the state that the anisotropic graphite powder and the binder component are mixed with each other.

As the need arises, a small amount of an organic solvent may be added thereto so as to improve the miscibility. However, it is necessary to remove the used solvent finally.

The composition is subjected to roll forming, press forming, extrusion forming or painting, thereby producing a primary sheet wherein the anisotropic graphite powder is oriented into substantially parallel to the main surfaces. Roll forming or press forming is preferred since the forming causes the anisotropic graphite powder to be surely oriented with ease.

The state that the anisotropic graphite powder is oriented into substantially parallel to the main surfaces of the sheet means that the anisotropic graphite powder is oriented so as to lie down along the main surfaces of the sheet. The direction of the anisotropic graphite powder in the sheet plane is controlled by adjusting the direction in which the composition flows when the composition is shaped.

Since the anisotropic graphite powder is basically made of particles having anisotropy, the roll forming, press forming, extrusion forming or painting of the composition usually causes the anisotropic graphite powder to be arranged in the state that the directions of the powders are consistent with each other.

Next, in the step (b), portions of the primary sheet(s) is(are) laminated onto each other, or the primary sheet is wound, thereby yielding a shaped body. The method for laminating the primary sheet(s) is not particularly limited, and is, for example, a method of putting the primary sheets onto each other, or a method of folding the primary sheet up.

At the time of the laminating, the sheet(s) should be laminated onto each other in the state that the directions of the anisotropic graphite powder particles are consistent with each other in the sheet plane. The shape of the primary sheet(s) is not particularly limited. For example, when rectangular primary sheets are laminated onto each other, a shaped body in a rectangular column form is obtained. When circular primary sheets are laminated onto each other, a shaped body in a circular column form is obtained.

The method for winding the primary sheet is not particularly limited, and it is advisable to wind the primary sheet around an axis along the orientation direction of the graphite powder (A). The form of the winding is not particularly limited, and may be, for example, circularly cylindrical or rectangularly cylindrical form.

In the step after the present step, the laminated body is sliced at an angle of 45 to 80 degrees to any normal line extended out from the surfaces of the primary sheet. For convenience thereof, the tensile force when laminating the primary sheet(s) onto each other or when winding the primary sheet is adjusted not only to such a small value that it does not occur that the slice surfaces each squash to become smaller than a necessary area, but also to such a large value that the sheet(s) is(are) satisfactorily bonded to each other.

Usually, the adjustment gives a sufficient bonding force between the laminated surfaces or wound surfaces. However, if the force is insufficient, it is allowable to apply a solvent, an adhesive or the like onto the primary sheet(s) in a thin layer, and then perform the laminating or winding, thereby yielding a shaped body. When it is feared that interfacial peeling of the primary sheet interface(s) is caused by stress generated under the slicing conditions, it is allowable to treat the shaped body thermally to cure the interface of the primary sheets partially or wholly, thereby yielding a shaped body, and then to slice the body. In this case, effective is a method of sandwiching the shaped body between heated metallic plates positioned on and beneath the body, and applying pressure thereto into such a degree that the shaped body does not deform. The heat radiation sheet yielded by treating the shaped body thermally (i.e., curing the shaped body) and then slicing the body does not need to be thermally treated in any subsequent step.

Next, in the step (c), the shaped body is sliced to yield a heat radiation sheet. The shaped body is sliced at an angle of 45 to 80 degrees to any normal line extended out from the surfaces of the primary sheet, preferably at an angle of 55 to 70 degrees thereto, thereby yielding a heat radiation sheet having a predetermined thickness.

When the shaped body is a laminated product, slicing it perpendicularly or substantially perpendicularly to the lamination direction of the primary sheet(s) (at the above-mentioned angle) can be carried out.

When the shaped body is a wound body, slicing it perpendicularly or substantially perpendicularly to the axis for the winding (at the above-mentioned angle) can be carried out.

When the shaped body is a shaped body in a circular column form wherein circular primary sheets are laminated onto each other, it is allowable to slice the body into thin long strips at an angle within the above-mentioned angle range like stripping the skin.

The method for the slicing is not particularly limited, and examples thereof include a multi-blade method, a laser processing method, a water jet method, and a knife processing method. The knife processing method is preferred, considering the thickness precision of the heat radiation sheet, and the smoothness of the sliced surfaces.

The cutting tool when slicing the shaped body is not particularly limited. It is preferred to use a slicing member having a moiety like a planer having a flat and smooth table surface having a slit, and a blade projected from the slit, wherein the length of the projection of the blade from the slit can be adjusted in accordance with a desired thickness of the heat radiation sheet since the binder component near the surfaces of the resultant heat radiation sheet is not easily cracked and the orientation of the graphite powder is not easily disturbed, and further the desired-thickness thin sheet is easily formed.

Specifically, it is preferred to use, as the slicing member, a planer or slicer equipped with a sharp blade. About the blade, the length of the projection thereof from the slit is made adjustable in accordance with a desired thickness of the heat radiation sheet, whereby the desired thickness can easily be obtained.

The temperature for the slicing is decided in accordance with the Tg (glass transition temperature) of the used thermoplastic rubber component (A), and the blend amount and the particle diameter of the used anisotropic graphite powder. Usually, the temperature is preferably within the range from −50 to +50° C. as the surface temperature of the shaped body. If the shaped body is sliced at a temperature more than +50° C., the softness of the whole shaped body increases so that the body is not easily sliced. Moreover, the orientation of the anisotropic graphite powder tends to be disturbed so that the heat-radiating property tends to decline.

If the slicing temperature is −50° C. or lower, the shaped body becomes hard and brittle. Thus, the heat radiation sheet obtained just after slicing tends to be easily cracked.

The thickness slicing the shaped body is decided at will in accordance with the usage, and others. The thickness is preferably within the range from about 0.1 to 5 mm.

If the thickness is 0.1 mm or less, the slices are not easily handled. If the thickness is 5 mm or more, the heat-radiating property tends to decline. The width of slicing the shaped body is the thickness of the heat radiating sheet of the invention, and the slice surfaces thereof are each a surface contacting a heat generation body or a heat radiation body.

<Heat Radiation Device of the Invention>

The heat radiation device of the invention is a device yielded by interposing the heat radiation sheet of the invention between a heat generation body and a heat radiation body. The use temperature thereof is preferably 200° C. or lower. If the use temperature is higher than 200° C., the softness of the binder component declines abruptly so that the heat-radiating property deteriorates. The use temperature is preferably within the range from −20 to 150° C. A semiconductor package, a display, an LED and others are given as preferred examples of the heat generation body.

Typical examples of the heat radiation body include a heat sink using a fin, plate or the like that is made of aluminum or copper, an aluminum or copper block connected to a heat pipe, an aluminum or copper block wherein a cooling liquid is circulated by means of a pump inside it, a Peltier element, and an aluminum or copper block equipped with this element.

The heat radiation device of the invention is formed by bringing each of the surfaces of the heat radiation sheet of the invention into contact with the heat generation body and the heat radiation body, respectively. The method for the contacting is not particularly limited as far as the method is a method capable of fixing the heat generation body, the heat radiation sheet, and the heat radiation body to each other in the state that these are caused to adhere sufficiently closely to each other. In order to sustain the close adhesion, preferred is a contacting method wherein force for pushing the members onto each other is sustained, such as a method of fixing the members with screws to interpose a spring therebetween, or a method of pinching the members with a clip.

EXAMPLES

Hereinafter, the invention will be specifically described giving examples. The invention is not limited by the examples.

<Formation of a Heat Radiation Sheet>

Example 1

(1) Production of Anisotropic Graphite Powder (Pulverized Powder of an Expanded Graphite Shaped Sheet)

An expanded graphite shaped sheet (trade name: CARBOFIT HGP-105, manufactured by Hitachi Chemical Co., Ltd.) was pulverized by means of a pulverizer (trade name: ROHTPLEX, manufactured by Hosokawa Micron Corp.), and the resultant pulverized powder was classified with a vibrating sieve to produce 2 kg of anisotropic graphite powder (expanded graphite sheet pulverized powder) having a distribution of particle sizes within the range from 500 to 1000 μm and a bulk density of 0.2 g/cm$^3$.

The form of the resultant anisotropic graphite powder was observed in an SEM photograph thereof. As a result, the form was a dendritic form.

(2) Production of a Composition, and Formation of a Primary Sheet

The temperature (barrel temperature) of a kneader (trade name: 1100-S-1 manufactured by Yoshida Seisakusho Co., Ltd.) having a volume of 1 and equipped with a pressuring tool was raised to 80° C. Thereinto were charged 211 g of an acrylic rubber (trade name: HTR-811DR, manufactured by Nagase ChemteX Corp., weight-average molecular weight: 500000, tackiness: large) as a thermoplastic rubber component (A), 80 g of a carboxyl-group-modified solid NBR (trade name: Nippol 1072, manufactured by Nippon Zeon Co., Ltd., weight-average molecular weight: 250000, carboxyl group concentration: 0.75 (KOHmg/g)), which is a solid at normal temperature, as a thermosetting rubber component (B) and 200 g of the anisotropic graphite powder produced in the above-mentioned item (1). The components were then mixed with each other for 10 minutes.

After the mixing was ended, the following mixture was incorporated into the above-mentioned mixture by four separated operations over 20 minutes (5 minutes per mixing-operation): 30 g of a liquid carboxyl-group-modified NBR (trade name: Nippol DN601, manufactured by Nippon Zeon Co., Ltd., weight-average molecular weight: 68000, carboxyl group concentration: 0.75 (KOHmg/g)), which is a liquid at normal temperature; and 150 g of a phosphate (trade name: CR-741 (viscosity: 2400 mpa·s. (40° C.)), manufactured by Daihachi Chemical Industry Co., Ltd.) as a flame retardant.

Thereafter, 318 g of the residue of the anisotropic graphite powder was charged thereinto, and then the components were mixed with each other for 20 minutes. Furthermore, thereinto was charged 11 g (10% by mass of the used NBR) of an epoxy-group-containing compound (trade name: Epicoat 828 (abbreviated to "Ep 828") hereinafter), number-average molecular weight: 380, type: bifunctional type, the number (chemical equivalent) of the epoxy group: 190 (liquid state)) as a thermosetting rubber curing agent (C). The components were then mixed with each other for 10 minutes to prepare a composition. In 100 parts by mass of the binder component (the total amount of the thermoplastic rubber component (A) and the thermosetting rubber component (B)) in the resultant composition, the amount of the acrylic rubber as the thermoplastic rubber component (A) was 65.7 parts by mass, and that of the NBR as the thermosetting rubber component (B) was 34.3 parts by mass.

The blend amount of the anisotropic graphite powder as the heat radiation material was 51.8% by mass of the whole blend. The viscosity of the mixture was as follows: 27 (at 60° C.), 20 (at 80° C.), and 15 (at 100° C.), which were each according to a Mooney viscometer (trade name: VR-1130 manufactured by Ueshima Seisakusho Co., Ltd.). In a case where the measurement temperature was taken as the transverse axis, the viscosity was taken as the vertical axis thereof and a change in the viscosity that followed a change in the temperature (the temperature dependency thereof) was observed, a linear relationship was obtained. This tendency was consistent with the tendency of the Mooney viscosity of the used mixture of the thermoplastic rubber component (A) and the thermosetting rubber component (B) (ratio by mass: 50/50) (the viscosity values were different from each other). It was determined that the dispersibility of the anisotropic graphite powder in the binder component was good, and a change in the nature of the binder component was small at the time of the mixing.

A primary sheet used for a shaped body was yielded as follows: First, 50 g of the composition produced in the item (2) was sandwiched between PET films each subjected to releasing treatment and each having a thickness of 0.1 mm, and a press was used at normal temperature to obtain a sheet having a thickness of about 3 mm. The resultant work sheet was passed between rolls (gap: 1.2 mm), the temperature of which was raised to 80° C., and then cooled to yield the primary sheet, which had a thickness of 1 mm. The density of this primary sheet was 1.4 g/cm$^3$.

(3) Lamination of of the Primary Sheets

The primary sheet formed by the item (2) was cut into 50 pieces having a size of 50 mm×25 mm along the roll direction. The cut sheets were uniformly laminated onto each other so as to give a lamination having the above-mentioned size. In this way, a shaped body was yielded.

Releasing paper pieces were brought into contact with the upper and the lower of the shaped body, and then the lamination was put onto a hand press having a pressing surface heated to 120° C. Metallic plates each having a thickness of 4.5 mm were set, as thickness adjusting members, onto both sides of the lamination, respectively. The resultant was pressed for 30 minutes, and then subjected to thermal treatment at 150° C. for 1 hour to produce a shaped body for slicing.

(4) Slicing of the Shaped Body

Use was made of a handmade slicing machine to which a slicer (for slicing an edible meat block into ham pieces) was applied. The shaped body produced in the item (3) was fixed onto the machine. The shaped body was cooled to set the surface temperature thereof into −10° C., and then the shaped body was sliced with a single blade fixed to a slicing table under conditions that the shaped-body-slicing rate was 60 mm/minute and the cutting angle was 30° to produce heat radiation sheets each having a thickness of 0.25 mm.

The heat radiation sheets yielded in Example 1 had been cured in the above-mentioned step (3). The crosslinkage density thereof was 95%.

The method for specifying the crosslinkage density was as follows: one of the heat radiation sheets was immersed in 50 mL of butyl acetate (first-class reagent, manufactured by Wako Pure Chemical Industries, Ltd.) at room temperature (25° C.) for 24 hours, and then taken out; a pressure-reduced drying machine, the temperature of which was raised to 90° C., was used to dry the sheet in a vacuum state for 2 hours; the mass of the sheet was measured; and on the supposition that the mass of the sheet before the sheet was immersed in butyl acetate was 100, the mass insoluble in butyl acetate was calculated out to specify the density.

An SEM (scanning electron microscope) was used to observe a cross section of one of the heat radiation sheets. About each of 50 particles of the anisotropic graphite powders selected at will, the angle of the long axis of the anisotropic graphite powder to the surfaces of the heat radiation sheet was measured along the direction in which the anisotropic graphite powders were viewed. The average value thereof was calculated. As a result, the value was 90 degrees. Thus, it was recognized that the anisotropic graphite powder was oriented into the thickness direction of the heat radiation sheet.

Example 2

(1) Production of Anisotropic Graphite Powder (Pulverized Powder of an Expanded Graphite Shaped Sheet)

The same as in the item (1) in Example 1 was used.

(2) Production of a Composition, and Formation of a Primary Sheet

As a thermoplastic rubber component (A), a thermosetting rubber component (B), and a thermosetting rubber curing agent (C), the following were used, respectively: 160.5 g of the HTR-811DR; 116.7 g of the Nippol 1072 and 43.8 g of the Nippol DN601 (the thermoplastic rubber component (A)/the thermosetting rubber component (B)=50/50 (parts by mass); and 16 g of the Ep828. In the same way as in the item (2) in Example 1 except the above, a composition having the same formulation as in the item (2) therein was produced, and a primary sheet was also produced. The Mooney viscosity of the composition at 80° C. was 23.

(3) Lamination of the Primary Sheets

The primary sheets were laminated onto each other in the same way as in the item (3) in Example 1, so as to yield a shaped body.

(4) Slicing of the Shaped Body

Heat radiation sheets were yielded in the same way as in the item (4) in Example 1.

Example 3

(1) Production of Anisotropic Graphite Powder (Pulverized Powder of an Expanded Graphite Shaped Sheet)

The same as in the item (1) in Example 1 was used.

(2) Production of a Composition, and Formation of a Primary Sheet

As a thermoplastic rubber component (A), a thermosetting rubber component (B), and a thermosetting rubber curing agent (C), the following were used, respectively: 110 g of the HTR-811DR; 153.6 g of the Nippol 1072 and 57.4 g of the Nippol DN601 (the thermoplastic rubber component (A)/the thermosetting rubber component (B)=50/50 (parts by mass); and 21.1 g of the Ep828. In the same way as in the item (2) in Example 1 except the above, a composition having the same formulation as in the item (2) therein was produced, and a primary sheet was also produced. The Mooney viscosity of the composition at 80° C. was 35.

(3) Lamination of the Primary Sheets

The primary sheets were laminated onto each other in the same way as in the item (3) in Example 1, so as to yield a shaped body.

(4) Slicing of the Shaped Body

Heat radiation sheets were yielded in the same way as in the item (4) in Example 1.

Comparative Example 1

(1) Production of Anisotropic Graphite Powder (Pulverized Powder of an Expanded Graphite Shaped Sheet)

The same as in the item (1) in Example 1 was used.

(2) Production of a Composition, and Formation of a Primary Sheet

In the same way as in the item (2) in Example 1 except that 332 g of the HTR-811DR as a thermoplastic rubber component (A) was used alone as a binder component without using any thermosetting rubber component (B) nor any thermosetting rubber curing agent (C), a mixture having the same formulation as in the item (2) in Example 1 was produced, and a primary sheet was produced. The Mooney viscosity of the composition at 80° C. was 25.

(3) Lamination of the Primary Sheets

The primary sheets were laminated onto each other in the same way as in the item (3) in Example 1, so as to yield a shaped body.

(4) Slicing of the Shaped Body

Heat radiation sheets were yielded in the same way as in the item (4) in Example 1.

Comparative Example 2

(1) Production of Anisotropic Graphite Powder (Pulverized Powder of an Expanded Graphite Shaped Sheet)

The same as in Example 1 was used.

(2) Production of a Composition, and Formation of a Primary Sheet

In the same way as in the item (2) in Example 1 except that no thermoplastic rubber component (A) was used, and 241.4 g of the Nippol 1072 and 90.64 g of the Nippol DN601 (crosslinkable rubbers alone) were used as a thermosetting rubber component (B), a composition having the same formulation as in the item (2) in Example 1 was produced, and a primary sheet was produced. The Mooney viscosity of the composition at 80° C. was 35.

(3) Lamination of the Primary Sheets

The primary sheets were laminated onto each other in the same way as in the item (3) in Example 1, so as to yield a shaped body.

(4) Slicing of the Shaped Body

Heat radiation sheets were yielded in the same way as in the item (4) in Example 1.

<Evaluations of the Heat Radiation Sheets>

About the heat radiation sheets yielded in each of Examples 1 to 3 and Comparative Examples 1 and 2, sheet properties thereof were evaluated as described below. The results are shown in Table 1. As the heat-radiating property, the measured value of the thermal resistance of one of the sheets was used.

[Test Methods]

(Sheet Density)

The thickness (according to a high-precision tight gauge), the dimension (according to a high-precision vernier caliper), and the mass (according to a chemical balance) of one of the sheets were measured, and the density was calculated by dividing the mass by the volume.

(Tackiness)

A metallic mirror plate was used. One of the resultant heat radiation sheets was made into a size of 10 mm×100 mm. In this way, a test sheet was formed. The sheet was caused to adhere onto the mirror plate without generating any air layer on the mirror plate. A clip was fitted to an upper region of the sheet, and the sheet was set to a spring scale. The sheet was then peeled off at a constant speed. The maximum value of the spring scale (measured at room temperature, 23° C.) was defined as the tackiness.

(Ascar C Hardness)

Several sheets of the resultant heat radiation sheets were put onto each other into a thickness of 10 mm, a length of 20 mm and a width of 20 mm. In this way, a test sheet was formed. A needle of a hardness meter (Ascar C) was pushed against the sheet. The value of the gauge (measured at room temperature, 23° C.) was defined as the hardness.

(Bondability)

One of the resultant heat radiation sheets was set into a size of 3 cm×3 cm. In this way, a test sheet was formed. Two aluminum flat plates (3 cm in width×2.0 mm in thickness×100 mm in length) were used. The test sheet was sandwiched between the upper of one of the aluminum flat plates and the lower of the other aluminum flat plate. These members were fixed onto each other with a clip, and the sandwich was thermally treated at 150° C. for 60 minutes, and then cooled. The resultant was prepared as a test piece. An autograph was used to make a tensile test thereof. The value lowered abruptly was defined as the bondability (measured at room temperature, 23° C.).

(Restorability)

From the resultant heat radiation sheets, two test sheets having a size of 20 mm×40 mm and two test sheets having a size of 20 mm×30 mm were formed. Use was made of a measuring tool and a measuring method described on pages 9 to 10 of JASO M303-95 (Automobile Standard, Nonmetallic Gasket Material, published by Automotive Engineers of Japan, Inc. (in 1995)). Before a bolt was heated, the elongation thereof was 0.018 mm. The test sample was thermally treated at 150° C. for 1 hour, and then cooled. From the bolt elongation after the cooling, the stress relaxation was calculated from the following equation (1):

$$\text{Stress relaxation } (\%) = (Do - Df)/Do \times 100 \qquad (1)$$

wherein Do: the bolt elongation (mm) before the heating, and Df: the bolt elongation (mm) after the heating.

(Handleability)

(Longitudinal Direction)

One of the resultant heat radiation sheets was made into a size of 20 mm×40 mm. In this way, a test sheet was formed. An autograph was used to make a tensile test of the test sheet in the longitudinal direction thereof (rotated at 90 degrees from the lamination surfaces). The value when the sheet was broken was defined as the handleability (measured at room temperature, 23° C.).

(Lamination Direction)

One of the resultant heat radiation sheets was made into a size of 20 mm×40 mm. In this way, a test sheet was formed. About the lamination direction of the test sheet, a measurement was made in the same way as described above. The resultant value was defined as the handleability.

(Thermal Resistance ° C.·cm²/W)

One of the resultant heat radiation sheets was made into a size of 1 cm in length×1.5 cm in width. In this way, a test sheet was formed. The sheet was sandwiched between a transistor (2SC2233) and an aluminum heat radiation block, and a pressure of 0.5 MPa was applied to the transistor, and electric current was caused to flow thereinto. The temperature T1 (° C.) of the transistor and the temperature T2 (° C.) of the heat radiation block were measured. From the measured values and the applied electric power W1 (W), the thermal resistance X (° C./W) was calculated in accordance with the following equation (2):

$$X = (T1 - T2)/W1 \qquad (2)$$

From the thermal resistance X (° C./W) according to the equation, the thickness d (μm) of the heat radiation sheet, and a correction coefficient C based on a sample having an already-known thermoconductivity, the thermoconductivity (W/mK) was estimated (measured at room temperature, 23° C.) by using the following equation (3):

$$Tc = C \times d/X \qquad (3)$$

(Flame Retardancy)

The flame retardancy was measured in accordance with the UL standard.

TABLE 1

| Test items | Example 1 | Example 2 | Example 3 | Comparative Example 1 | Comparative Example 2 |
|---|---|---|---|---|---|
| Sheet density (g/cm³) | 1.30 | 1.30 | 1.30 | 1.30 | 1.30 |
| Tackiness (gf) | 85 | 80 | 75 | 100 | 50 |

TABLE 1-continued

| Test items | Example 1 | Example 2 | Example 3 | Comparative Example 1 | Comparative Example 2 |
|---|---|---|---|---|---|
| Ascar C hardness | 50 | 55 | 60 | 40 | 70 |
| Bondability (MPa) | 0.07 | 0.1 | 0.12 | 0.01 | 0.05 |
| Restorability(%) (Stress relaxation) | 45 | 30 | 35 | 80 | 20 |
| Handleability (MPa) | 0.2 | 0.5 | 0.6 | 0.05 | 1.2 |
| (Longitudinal direction) (Lamination) | 0.07 | 0.2 | 0.25 | 0.01 | 0.02 |
| Thermal resistance (° C. · cm$^2$/W) [Pressure: 0.5 MPa] | 0.04 | 0.035 | 0.035 | 0.07 | 0.11 |
| Flame retardancy | V-0 | V-0 | V-0 | V-0 | V-0 |

INDUSTRIAL APPLICABILITY

The invention makes it possible to provide a heat radiation sheet that is excellent in heat-radiating property (thermoconductivity) and good in balance between sheet properties (tackiness, heat resistance, softness and strength).

The invention claimed is:

1. A heat radiation sheet, wherein anisotropic graphite powder is oriented into a specified direction in a binder component comprising each of: (A) a thermoplastic rubber component selected from the group consisting of an acrylic rubber, ethylene-propylene rubber, butyl rubber, styrene butadiene rubber and NBR; (B) an uncured thermosetting rubber component including both (a) a carboxyl-group-modified solid synthetic rubber that is a solid at normal temperature and has a weight-average molecular weight within the range of 150,000 to 500,000, and (b) a carboxyl-group-modified liquid synthetic rubber that is a liquid at normal temperature and has a weight-average molecular weight within the range of 30,000 to 90,000; and (C) a thermosetting rubber curing agent, which is an epoxy-group-containing compound configured to be reacted with the uncured thermosetting rubber component (B), wherein the orientation in the specified direction is an orientation in the thickness direction of the heat radiation sheet, and wherein the uncured thermosetting rubber component (B) is capable of being cured by the thermosetting rubber curing agent (C) to form a cured composition.

2. The heat radiation sheet according to claim 1, wherein a crosslinkage density obtained by crosslinking between the thermosetting rubber component (B) and the thermosetting rubber curing agent (C) is adjusted.

3. A heat radiation device, wherein the heat radiation sheet according to claim 2 is combined with a member different therefrom.

4. The heat radiation sheet according to claim 1, further comprising a phosphoric ester.

5. A heat radiation device, wherein the heat radiation sheet according to claim 4 is combined with a member different therefrom.

6. The heat radiation sheet according to claim 1, wherein the anisotropic graphite powder is pulverized powder of an expanded graphite shaped sheet and has a lamella needle branch shape or a dendritic shape.

7. A heat radiation device, wherein the heat radiation sheet according to claim 6 is combined with a member different therefrom.

8. The heat radiation sheet according to claim 1, wherein an average particle diameter of the anisotropic graphite powder is within a range from 50 to 2000 μm, and a bulk density thereof is within a range from 0.1 to 1.5 g/cm$^3$.

9. A heat radiation device, wherein the heat radiation sheet according to claim 8 is combined with a member different therefrom.

10. The heat radiation sheet according to claim 1, which is obtained by a method comprising the steps of:
    forming a primary sheet by orienting a composition comprising the anisotropic graphite powder and the binder component so as to make the anisotropic graphite powder in the composition into a direction substantially parallel to the main surfaces;
    yielding a shaped body by laminating the primary sheet(s) onto each other; and
    slicing the shaped body at an angle of 45 to 80 degrees to any normal line extended out from the surfaces of the primary sheet.

11. A heat radiation device, wherein the heat radiation sheet according to claim 10 is combined with a member different therefrom.

12. The heat radiation sheet according to claim 1, which is obtained by a method comprising the steps of:
    forming a primary sheet by orienting a composition comprising the anisotropic graphite powder and the binder component so as to make the anisotropic graphite powder in the composition into a direction substantially parallel to the main surfaces;
    yielding a shaped body by winding the primary sheet around an axis along the orientation direction of the anisotropic graphite powder; and
    slicing the shaped body at an angle of 45 to 80 degrees to any normal line extended out from the surfaces of the primary sheet.

13. A heat radiation device, wherein the heat radiation sheet according to claim 12 is combined with a member different therefrom.

14. A heat radiation device, wherein the heat radiation sheet according to claim 1 is combined with a member different therefrom.

15. The heat radiation sheet according to claim 1, wherein the heat radiation sheet is configured to turn into a state that (i) the thermoplastic rubber component (A), and (ii) the thermosetting rubber component (B) crosslinked with the thermosetting rubber curing agent (C), are in a mixture with each other after the heat radiation sheet has been thermally treated.

16. The heat radiation sheet according to claim 1, wherein amount of each of the thermoplastic rubber component (A) and the uncured thermosetting rubber component (B) in the heat radiation sheet is 10 to 70 parts by weight relative to 100 parts by weight of the total of the thermoplastic rubber component (A) and the uncured thermosetting rubber component (B) in the binder component.

17. The heat radiation sheet according to claim 1, wherein the uncured thermosetting rubber component (B) includes a carboxyl-group-modified solid NBR.

18. The heat radiation sheet according to claim 1, wherein the anisotropic graphite powder has an average particle diameter in a range of 50 to 2,000 µm.

19. The heat radiation sheet according to claim 1, wherein the thermoplastic rubber component (A) is an acrylic rubber, and the uncured thermosetting rubber component (B) includes a carboxyl-group-modified NBR.

20. The heat radiation sheet according to claim 1, wherein
the amount of each of the thermoplastic rubber component (A) and the uncured thermosetting rubber component (B) in the heat radiation sheet is 10 to 70 parts by weight relative to 100 parts by weight of the total of the thermoplastic rubber component (A) and the uncured thermosetting rubber component (B) in the binder component, and
the amount of the thermosetting rubber curing agent (C) is 1 to 30 parts by mass relative to 100 parts by mass of the uncured thermosetting rubber component (B).

21. A heat radiation member, comprising the heat radiation sheet according to claim 1, the heat radiation member formed by completely curing the uncured thermosetting rubber component (B) and the thermosetting rubber curing agent (C) of the heat radiation sheet.

22. The heat radiation sheet according to claim 1, wherein the heat radiation sheet is in a state that (i) the thermoplastic rubber component (A), and (ii) the thermosetting rubber component (B) crosslinked with the thermosetting rubber curing agent (C), are in a mixture with each other after the heat radiation sheet has been thermally treated.

23. The heat radiation sheet according to claim 1, wherein the thermoplastic rubber component (A) includes an acrylic rubber, and an amount of the thermoplastic rubber component (A) in the heat radiation sheet is 10 to 70 parts by weight relative to 100 parts by weight of the total of the thermoplastic rubber component (A) and the uncured thermosetting rubber component (B) in the binder component.

* * * * *